United States Patent [19]
Du

[11] Patent Number: 5,393,246
[45] Date of Patent: Feb. 28, 1995

[54] TRANSMISSION POWER TESTING BAR OF CABLE TELEVISION SYSTEM

[76] Inventor: Sing-Long Du, No. 257, Sec. 5, Roosevelt Rd., Taipei, Taiwan, Prov. of China

[21] Appl. No.: 194,527

[22] Filed: Feb. 10, 1994

[51] Int. Cl.⁶ ............................................. H01R 11/18
[52] U.S. Cl. .................................. 439/482; 439/912; 439/578
[58] Field of Search ................. 439/482, 483, 912, 578

[56] References Cited

U.S. PATENT DOCUMENTS 4,180,302  12/1979  Gordon ................................ 339/143
4,904,213   2/1990  Hock ................................... 439/824

Primary Examiner—Larry I. Schwartz
Assistant Examiner—Jill DeMello
Attorney, Agent, or Firm—Browdy and Neimark

[57] ABSTRACT

A transmission power testing bar of a cable television system is coupled to the test hole of a main line distributor and provided with an inner sleeve having therein a test set member comprising a test point, an attenuation line, and an insertion hole. The inner sleeve is provided at one end thereof with a spring for providing the test set member with an elastic force enabling the test point to urge intimately the center point of the test hole of the main line distributor. The testing bar further comprises an outer sleeve and a copper connection head. The outer sleeve is fitted over the inner sleeve and the spring such that the outer sleeve can be caused to move axially. The copper connection head is fastened at one end thereof with the inner sleeve and at another end thereof with a signal gauge for measuring the transmission power value of a coaxial cable.

2 Claims, 3 Drawing Sheets

5,393,246

TRANSMISSION POWER TESTING BAR OF CABLE TELEVISION SYSTEM

FIELD OF THE INVENTION

The present invention relates generally to a test bar, and more particularly to a test bar for use in combining the main line distributors of a cable television system.

BACKGROUND OF THE INVENTION

The television set of a cable television subscriber receives the program signals directly from the coaxial cable. With a view to cutting the cost of the coaxial cable and allowing more subscribers to receive the program signals on the same coaxial cable, the cable television operator makes use of a main line distributor on the primary line so as to distribute the program signals to a plurality of the secondary lines capable of reaching a number of cable television subscribers. In addition, the cable television operator must determine the extent of the loss of the transmission power of the coaxial cable in the course of transmission. Therefore, the main line distributor is provided additionally with a test hole for testing the magnitude of the power signal in order to determine if a power amplifier is called for. As shown in FIG. 1, a main line distributor 10 capable of branching out one primary line into three secondary lines is provided with a housing 11 having respectively at both front and rear ends thereof two connecting heads 12 for use in connecting the secondary lines of the subscribers with the primary line of the cable television antenna line transmission system. The housing 11 is further provided respectively in both left and right sides thereof with a test hole 14 having axially a test point, which is not shown in the drawing, for use as a reference in testing the magnitude of the power signal at the time when the subscriber's antenna is receiving the signal. The shortcomings inherent in the prior art power testing are described explicitly hereinafter.

The main line distributor 10 is generally fastened to a telephone pole or a rooftop. As a result, it is often inconvenient as well as hazardous for a technician to climb up to the main line distributor 10 to touch with a signal gauge the test point of the test hole 14 of the main line distributor 10. In addition, the test result is often inaccurate because the test is done hastily by the technician who is more concerned about his or her own safety.

The prior art power testing requires that the signal gauge is caused to make a direct contact with the test point of the test hole 14 of the main line distributor 10. Such a prior art testing method can often bring about an inaccurate power testing value in view of the fact that the direct contact between the signal gauge and the test point can result in an antagonism of impedance between the signal gauge and the coaxial cable.

SUMMARY OF THE INVENTION

The primary objective of the present invention is, therefore, to provide a transmission power testing bar intended for use in the cable television system and provided therein with a line having attenuation value so as to minimize the loss of the impedance matching at the time when the coaxial cable is contacted by the signal gauge.

Another objective of the present invention is to provide a transmission power testing bar having an appropriate elasticity for use in the cable television system. Such a transmission power testing bar can be caused to make an intimate contact with the test point of the main line distributor, thanks to the elasticity of the transmission power testing bar.

The foregoing objectives of the present invention are attained by the transmission power testing bar, which comprises a test set member, an inner sleeve, an outer sleeve, and a copper connection head. The test set member is made of a metal material and provided in the axial hole thereof with an attenuation line. The test set member is coupled at one end thereof with one end of a nonconductive connection rod which has another end provided with a test point in communication with the attenuation line. The test set member is coupled at another end thereof with a nonconductive engaging tube having axially a round hole communicating with the attenuation line. The inner sleeve of a metal material has circumferentially a first portion and a second portion. In addition, the inner sleeve has axially a through hole dimensioned to receive therein the test set member. The through hole has one end that is threaded and another end that is flat. The first stepped portion is provided with a spring. The outer sleeve of a metal material has circumferentially an outer threaded portion and has an axial hole. The copper connection head is provided axially with a through hole having at the front end thereof a protruded portion and having circumferentially a stepped ring forming an outer threaded portion. The outer threaded portion of the outer sleeve is coupled with the test hole of a main line distributor. With the help of the elastic force of the spring, the test point of the test set member is caused to urge tightly the center point of the test hole of the main line distributor so as to ensure that the signal gauge fastened to the copper connection head is enabled to measure accurately the power testing value.

DETAILED DESCRIPTION OF THE INVENTION

Figure 1:
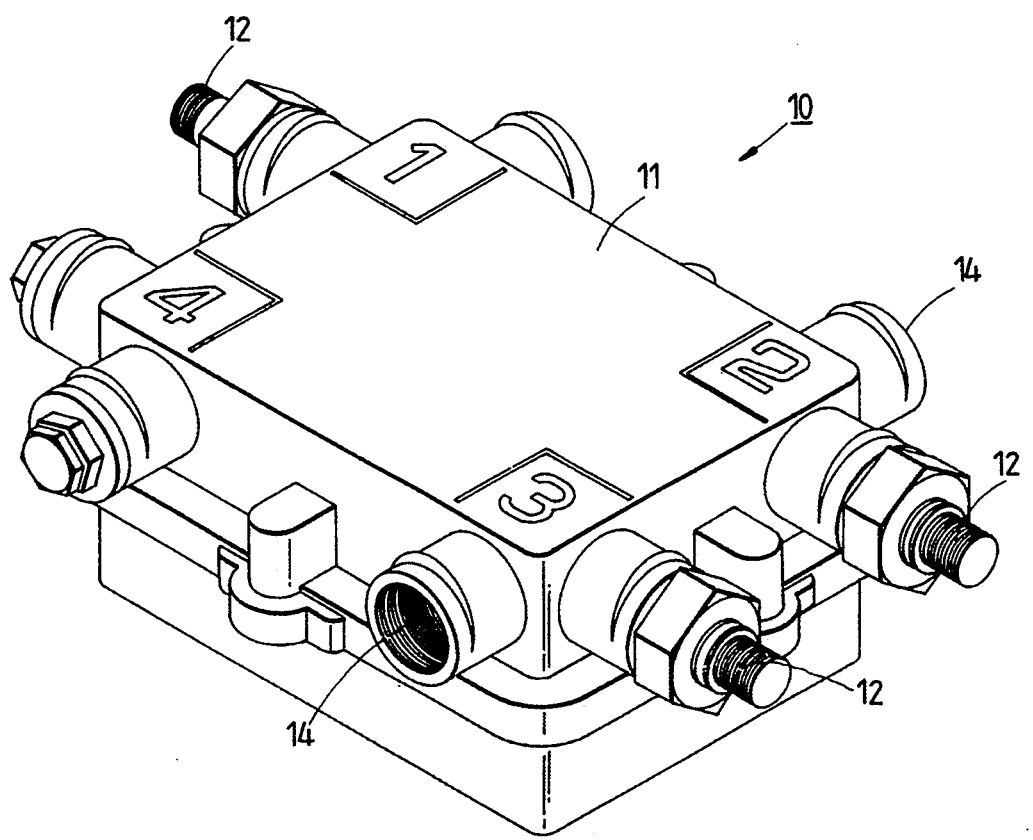
FIG. 1 shows a perspective view of a main line distributor of the prior art.
Figure 3:
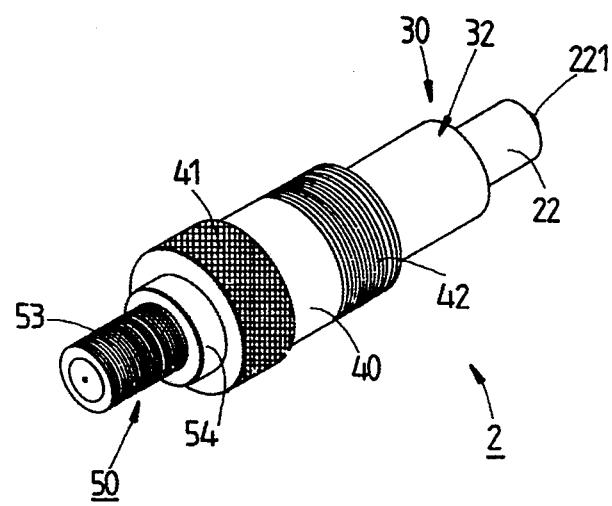
FIG. 3 shows a perspective view of the present invention in combination as shown in FIG. 2.
Figure 2:
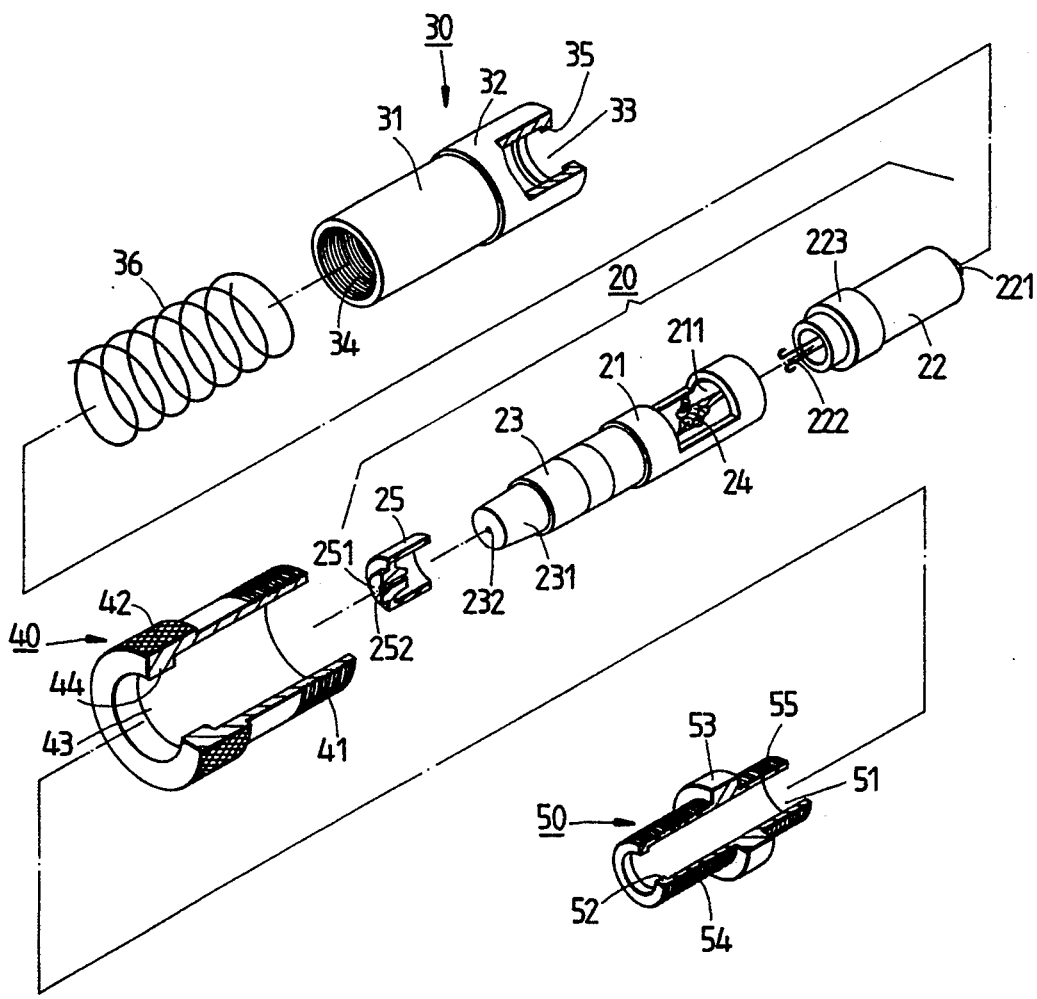
FIG. 2 shows an exploded view of the present invention.
Figure 4:
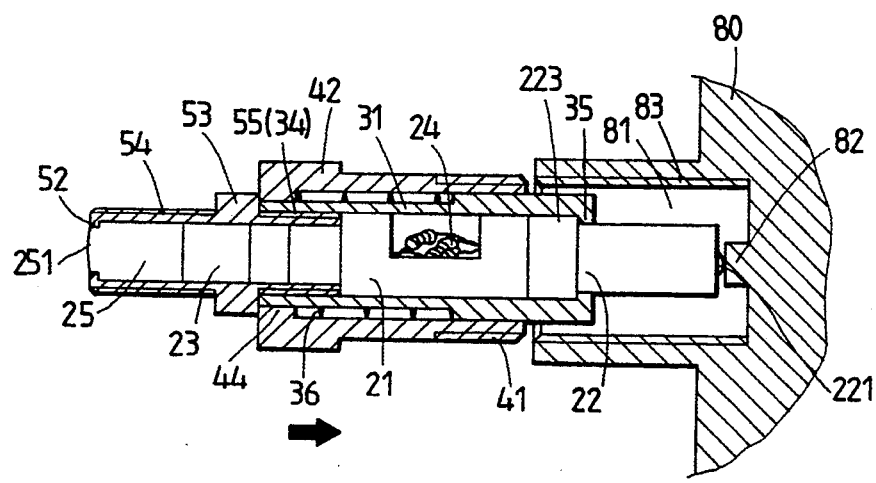
FIG. 4 shows a sectional view of a test bar of the present invention before being joined with a main line distributor.

Referring to FIGS. 2-4, a cable television transmission power testing bar 2 embodied in the present invention is fastened to the test hole of a conventional main line distributor and is composed of a test set member 20, an inner sleeve 30, an outer sleeve 40 and a copper connection head 50.

The test set member 20 comprises a test rod 21, a connection rod 22, and an engaging tube 23. The test rod 21 of a metal material has an axial hole 211 receiving therein an attenuation line 24. The connection rod 22 of a plastic material has one end that is coupled with the test rod 21 and another end that is provided with a test point 221 communicating with the attenuation line 24 of the test rod 21 by means of a copper wire 222 located in the axis of the test point 221. The connection rod 22 is provided circumferentially with a stepped portion 223. The engaging tube 23 of a plastic material has one end that is connected with the test rod 21 and another end that is provided with a tapered portion 231 which is fitted over with a tightening casing 25 of a rubber material. The tightening casing 25 is provided at the anterior end thereof with a round projection 251 and is further provided axially with a round hole in communication with a round hole 232 of the engaging tube 23 for allowing a probe of the signal gauge (not shown in the drawings) to be inserted thereinto to communicate with the attenuation line 24 of the test rod 21.

The inner sleeve 30 of a metal material has a first portion 31, a second portion 32, and a through hole 33 located axially for receiving therein the test set member 20. The through hole 33 has one end that is adjacent to the first portion 31 and is provided with an inner threaded portion 34. The through hole 33 has another end that is provided with a protruded ring 35 to be urged by the stepped portion 223 of the connection rod 22 of the test set member 20. The first portion 31 is fitted into a spring 36 having one end which urges a junction between the first portion 31 and the second portion 32.

The outer sleeve 410 of a metal material is provided circumferentially at one end thereof with an embossed portion 42 and at another end thereof with an outer threaded portion 41. The outer sleeve 40 is further provided axially with a fitting hole 43 dimensioned to fit over the second portion 32 of the inner sleeve 30 and the spring 36. The fitting hole 43 has one end that is adjacent to the embossed portion 42 and provided annularly with a flat portion 44 to be urged by the spring 36 of the inner sleeve 30.

The copper connection head 50 is provided axially with a through hole 51 dimensioned to receive therein the engaging tube 23 and the tightening casing 25 of the test set member 20. The through hole 51 is provided at the anterior end thereof with a protruded portion 52 to be pressed against by the round projection 251 of the tightening casing 25. The copper connection head 50 is provided at the midsection thereof with a protruded ring 53. Located on both sides of the protruded ring 53 are two outer threaded portions 54 and 55, with the threaded portion 55 being engageable with the inner threaded portion 34 of the inner sleeve 30, and with the threaded portion 54 being engageable with the test head of the signal gauge.

In combination, the test set member 20 is first received in the through hole 33 of the inner sleeve 30 such that the stepped portion 223 of the connection rod 22 presses against the protruded ring 35 of the inner sleeve 30, as shown in FIG. 4. The spring 36 is then fitted over the first portion 31 of the inner sleeve 30 such that the outer sleeve 40 is fitted over the spring 36 and the second portion 32, and that the flat portion 44 of the outer sleeve 40 is urged by the spring 36. Finally, the outer threaded portion 55 of the copper connection head 50 is caused to engage the inner threaded portion 34 so as to ensure that the outer sleeve 40 is confined by the protruded ring 53 of the copper connection head 50 and that the outer sleeve 40 does not become disengaged with the inner sleeve 30.

Figure 5:
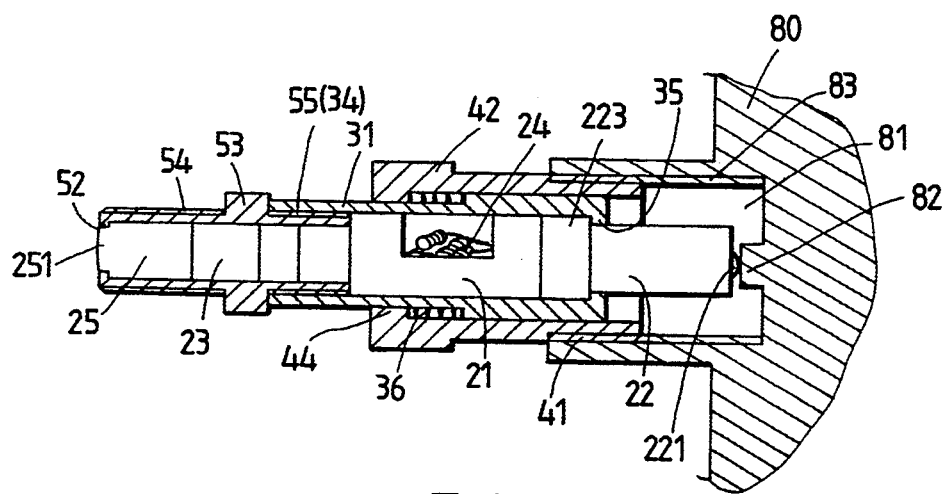
FIG. 5 shows a sectional view of the test bar of the present invention after being joined with the main line distributor.

In using the testing bar 2 of the present invention, the embossed portion 41 of the outer sleeve 40 is held with fingers to cause the test point 221 of the connection rod 22 of the test set member 20 to make contact with the center point 82 of the test hole 81 of the main line distributor 80, as shown in FIG. 4, so as to cause the spring 36 to compress. Thereafter, the outer threaded portion 42 of the outer sleeve 40 is caused to engage securely the inner threaded portion 83 of the test hole 8i, thereby causing the testing bar 2 to be fastened securely with the main line distributor 80, as shown in FIG. 5. It is then ready for the technician to insert the probe of the signal gauge into the round hole 252 of the tightening casing 25. The power transmission value of the coaxial cable is then measured via the attenuation line 24 of the test set member 20. The power transmission value of the coaxial cable can be so measured accurately by virtue of the fact that the attenuation line 24 makes it possible to reduce the power loss at the time when the testing bar 2 is matched with the impedance of the main line distributor 80.

The test point 221 of the connection rod 22 of the testing bar 2 of the present invention can be caused to make an intimate contact with the center point 82 of the main line distributor 80, thanks to the elastic force of the spring 36 of the inner sleeve 30.

The embodiment of the present invention described above is to be regarded in all respects as merely illustrative and not restrictive. Accordingly, the present invention may be embodied in other specific forms without deviating from the spirit thereof. The present invention is therefore to be limited only by the scope of the following appended claims.

What is claimed is:

1. A transmission power testing bar of a cable television system comprising:
    a test set member including a metal material and provided with an axial hole dimensioned to receive therein an attenuation line, said test set member further provided at one end thereof with a nonconductive connection rod coupled thereto, said connection rod having a test point in communication with said attenuation line, said test set member still further provided with at another end thereof with a nonconductive engaging tube having axially a through hole in communication with said attenuation line;
    an inner sleeve of a metal material and having circumferentially a first portion and a second portion, said inner sleeve further having axially a through hole dimensioned to receive therein said test set member and provided at one end thereof with an inner threaded portion and at another end thereof with a protruded ring, said first portion being fitted into a spring;
    an outer sleeve of a metal material and provided circumferentially with an outer threaded portion and further provided axially with a fitting hole having a flat portion opposite in location to said outer threaded portion, dimensioned to receive said inner sleeve; and
    a copper connection head provided axially with a through hole having at an anterior end thereof a protruded portion, said copper connection head further provided at a midsection thereof with a protruded ring located between two outer threaded portions, said copper connection head being inserted through said fitting hole and threadably engaged in said inner threaded portion;
    wherein said outer threaded portion of said outer sleeve is engageable with a test hole of a main line distributor of a cable television system; and
    wherein said test set member is provided with an elastic force by said spring so as to cause a test point of said test set member to urge intimately a center point of said test hole of said main line distributor, thereby enabling a signal gauge fastened to said copper connection head to measure accurately a transmission power value of a coaxial cable of said cable television system.

2. The transmission power testing bar of claim 1 wherein said outer sleeve is provided circumferentially with an embossed portion opposite in location to one end of said outer threaded portion of said outer sleeve.

* * * * *